United States Patent
Kister et al.

(10) Patent No.: US 7,189,078 B2
(45) Date of Patent: Mar. 13, 2007

(54) SEE-SAW INTERCONNECT ASSEMBLY WITH DIELECTRIC CARRIER GRID PROVIDING SPRING SUSPENSION

(75) Inventors: January Kister, Portola Valley, CA (US); James Jaquette, Mesa, AZ (US); Gene Tokraks, Gilbert, AZ (US)

(73) Assignee: Antares conTech, Inc., Gilbert, AZ (US)

( * ) Notice: Subject to any disclaimer, the term of this patent is extended or adjusted under 35 U.S.C. 154(b) by 0 days.

(21) Appl. No.: 11/077,054

(22) Filed: Mar. 10, 2005

(65) Prior Publication Data

US 2005/0159027 A1 Jul. 21, 2005

Related U.S. Application Data

(63) Continuation of application No. 10/759,338, filed on Jan. 16, 2004, now Pat. No. 7,059,865.

(51) Int. Cl.
*H01R 12/00* (2006.01)
(52) U.S. Cl. ........................................................ 439/66
(58) Field of Classification Search .................. 439/66, 439/67, 591, 862, 71, 91
See application file for complete search history.

(56) References Cited

U.S. PATENT DOCUMENTS

| | | | |
|---|---|---|---|
| 4,620,632 A * | 11/1986 | Alemanni | 206/724 |
| 5,015,191 A | 5/1991 | Grabbe et al. | |
| 5,228,861 A * | 7/1993 | Grabbe | 439/66 |
| 5,747,140 A * | 5/1998 | Heerklotz | 428/131 |
| 6,029,344 A * | 2/2000 | Khandros et al. | 29/874 |
| 6,384,475 B1 | 5/2002 | Beroz et al. | |
| 6,716,037 B2 | 4/2004 | Kung et al. | |
| 6,749,440 B1 * | 6/2004 | Szu et al. | 439/66 |
| 6,752,634 B2 * | 6/2004 | Gonzalez et al. | 439/66 |
| 6,913,662 B2 * | 7/2005 | Barilovits et al. | 156/60 |
| 6,963,033 B2 * | 11/2005 | Kim et al. | 174/260 |
| 2003/0060061 A1 | 3/2003 | Gonzalez et al. | |

* cited by examiner

*Primary Examiner*—J. F. Duverne
(74) *Attorney, Agent, or Firm*—Snell & Wilmer L.L.P.

(57) ABSTRACT

An interconnect assembly includes a number of interconnects combined in a preferably planar dielectric carrier frame having resilient portions acting as spring members in conjunction with their respective interconnect's rotational displacement during operational contacting. Each interconnect is fabricated as a see-saw structure pivoting around a rotation axis that substantially coincides with a symmetry plane of the torsion features provided by the resilient portion. The torsion features protrude towards and adhere to a central portion of the see-saw interconnect such that an angular movement of the interconnect is resiliently opposed by the torsion feature and the resilient portion. The torsion features and interconnects may be independently optimized to provide the interconnect with maximum stiffness and a maximum deflection at same time.

54 Claims, 9 Drawing Sheets
(2 of 9 Drawing Sheet(s) Filed in Color)

SEE-SAW INTERCONNECT ASSEMBLY WITH DIELECTRIC CARRIER GRID PROVIDING SPRING SUSPENSION

This application is a Continuation of application Ser. No. 10/759,338 filed on Jan. 16, 2004 now U.S. Pat. No. 7,059,865.

FIELD OF INVENTION

The present invention relates to Interconnect assemblies for repetitively establishing conductive contact between opposing contact arrays. Particularly, the present invention relates to interconnect assemblies having a number of arrayed interconnect stages including see-saw interconnects embedded in a spring force providing dielectric carrier structure.

BACKGROUND OF INVENTION

Demand for ever decreasing chip fabrication costs forces the industry to develop new solutions for inexpensive and reliable chip testing devices. A common component for repetitively contacting contact arrays of tested circuit chips is an interconnect assembly that is placed adjacent a test apparatus contact array that has contact pitch corresponding to the tested chips' carrier (package) contact pitch. During packaged chip testing, a package is brought with its contact array into contact with the interconnect assembly such that an independent conductive contact is established between each of the package's contacts and the corresponding contact of the test apparatus.

Interconnect arrays have to provide highly uniform contact resistance over a desirably large deflection range to reduce degrading measurement influences of dimensional test contact variations. With decreasing contact pitches and increasing numbers of test contacts of packaged chips, it becomes increasingly challenging to design interconnect arrays that can be fabricated with low fabrication costs while meeting the demand for maximum deflection with an ever decreasing footprint available for each interconnect stage. The present invention meets this challenge.

Further desirable characteristics of an interconnect array are minimum path lengths and complexity of the individual conductive paths within the interconnect array to improve electrical performance and minimal overall contact force necessary to reliably establish all required conductive paths across the interconnect array. These characteristics become increasingly important as test frequencies and number of conductive paths within a single interconnect array increase. The present invention addresses these needs.

Each individual interconnect has to provide a maximum deflection within a given footprint commonly defined by the contact pitch. At the same time, each interconnect has to provide sufficient structural stiffness to warrant sufficient scribing in the interface between contact tips of the interconnects and the respective contacts of the package's contacts. In the prior art, planar arrayed interconnects have been fabricated with varying shapes, commonly embedded in substantially rigid dielectric carrier structures or carrier frames. For example, interconnects have been fabricated as see-saw structures integrated with torsion beams or torsion bridges that assist in increasing the interconnects' overall deflection. The interconnects are embedded thereby in the carrier structure such that the carrier structure remains structurally substantially unaffected by the interconnects deflections. Spring loaded deflection and wear resistant contacting features are provided by the same monolithic structure. This poses a significant limitation on maximizing deflection range due to the opposing material requirements for stiffness of the contacting features and resilience of the spring features. In the present invention addresses this problem.

For a cost effective and reliable fabrication of interconnect assemblies there exists a need for a interconnect configuration that requires a minimum number of involved fabrication steps and individual components. Fabrication steps are preferably performed along a single axis. Assembling operations are preferably avoided. The present invention addresses this need.

SUMMARY OF THE INVENTION

An interconnect assembly includes a number of conductive and relatively stiff interconnect structures combined in a preferably planar dielectric carrier grid that has relatively resilient portions. The resilient portions act as spring members that resiliently deform upon the interconnects' displacement that takes place when a packaged chip is brought into contact with the interconnect assembly.

Each interconnect structure is fabricated and combined with the carrier grid for performing a see-saw pivoting movement around a rotation axis that substantially coincides with a symmetry plane of torsion features that are part of the resilient portions. The torsion features protrude laterally towards and adhere to a central portion of the see-saw interconnect such that an angular movement of the interconnect is resiliently opposed by the torsion feature and the remainder of the resilient portions. The resilient portions and interconnects may be independently optimized to provide the interconnects with maximum deflection stiffness, wear resistance, and conductivity.

Contacts of the test apparatus are in an offset to the test contacts. The substantially rotationally symmetric configuration of each see-saw interconnect with respect to its respective pivot axis results mainly in a torque that needs to be opposed by the respective resilient portion. A symmetric configuration of the resilient portion results in a balanced counteracting torque such that the overall position of the interconnects remains highly unaffected during the interconnects' displacement.

Each see-saw interconnect features at least one contact tip at each of the interconnects' opposing ends. The interconnect may be configured for multipath current transmission.

The initial contact force of the tips may be tuned by adjusting the angle of the see-saw interconnect with respect to the approach direction of the test contacts. This may be utilized to improve the tips' scribing on the test pads.

BRIEF DESCRIPTION OF THE FIGURES

The patent or patent application file contains at least one drawing executed in color. Copies of this patent or patent application publication with color drawing(s) will be provided by the Patent and Trademark Office upon request and payment of necessary fee.

DETAILED DESCRIPTION

In the following the terms "horizontal, vertical, upwards, downwards, bottom, top, X-oriented, Y-oriented" are used in conjunction with the Figures. As it may be clear to anyone skilled in the art, these terms are used solely for the purpose of ease of understanding and to describe spatial relations of elements with respect to each other.

Figure 1:
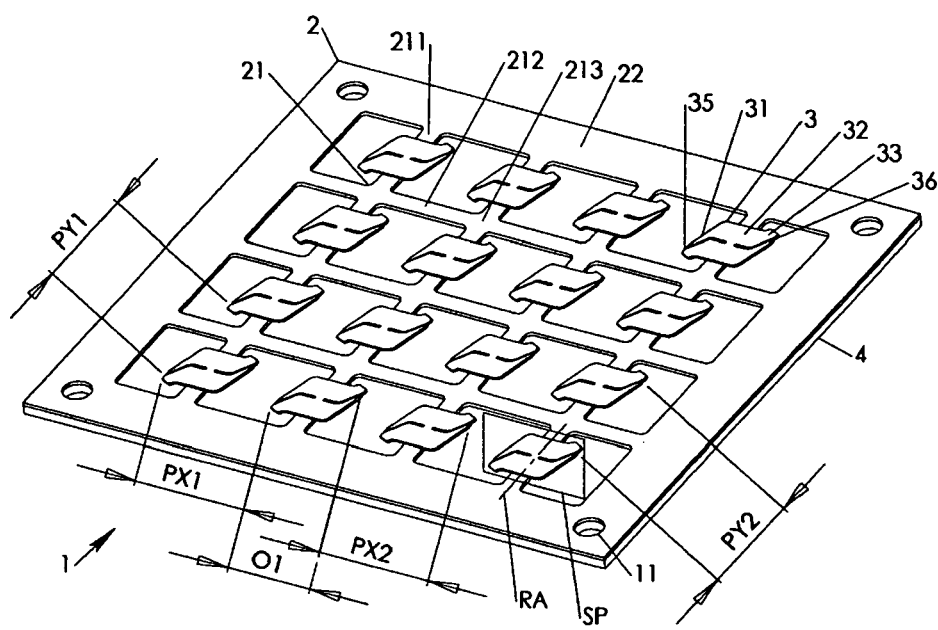
FIG. 1 is a perspective top view of an interconnect assembly in accordance with a first embodiment of the present invention.
Figure 2:
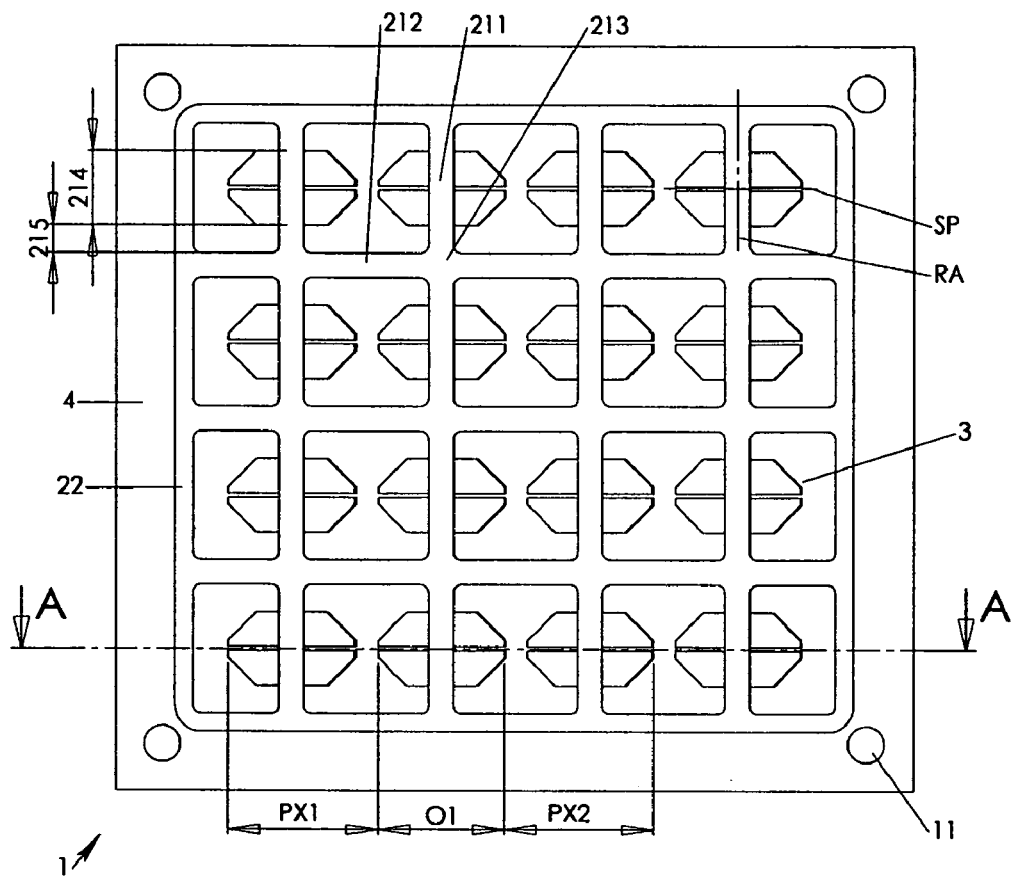
FIG. 2 illustrates a bottom view of the assembly of FIG. 1.

FIGS. 1, 2 show an interconnect assembly 1 that includes a horizontal dielectric film 2 circumferentially adhering to a support frame 4 via a grid flange 22. Shaped in the dielectric film 2 is a carrier grid 21, which may have X-oriented grid members 212 and Y-oriented grid members 211 that connect in the grid nodes 213. On centered locations of the Y-oriented grid members 211 adhere electrically conductive see-saw structures 3. Preferably each of the see saw structures 3 has a planar central portion 32 that overlaps with an interface portion 214 of the grid members 211. The see-saw structures 3 are connected to the carrier grid 21 via the interface portion 214. The interconnect assembly 1 may have alignment features 11 well known for precision positioning the interconnect assembly 1 in a larger device such as a well known probe apparatus 100 a portion of which can be seen in FIG. 3.

Preferably each of the conductive see-saw structures 3 is substantially symmetric with respect to a symmetry plane SP, which is in vertical orientation and in the middle between two X-oriented grid members 212. A first peripheral arm 31 extends laterally downwards from the planar center portion 32 along the symmetry plane SP and terminates in a first contact tip 35. A second peripheral arm 33 extends laterally upwards from the planar center portion 32 in opposite direction of the first peripheral arm 31 also along the symmetry plane SP. The second peripheral arm 33 terminates in a second contact tip 36. The see-saw structures 3 are preferably sheet metal like structures preferably made with well-known electro deposition techniques in conjunction with a 3D forming operation.

The see-saw structures 3 are preferably two dimensionally arrayed within the interconnect assembly 1 such that the first tips 35 comply with a first contact pattern defined by a first X-pitch PX1 and a first Y-pitch PY1. Accordingly, the second tips 36 comply with a second contact pattern defined by a second X-pitch PX2 and a second Y-pitch PY2. In the preferred embodiment, all see-saw structures 3 are arrayed in parallel and have substantially equal shape and scale such that the first contact pattern is in a tip offset O1 to the second contact pattern but otherwise substantially equal. The tip offset O1 is defined by the horizontal distance between the contact tips 35, 36 along the symmetry plane SP of a common see-saw structure 32.

Figure 3:
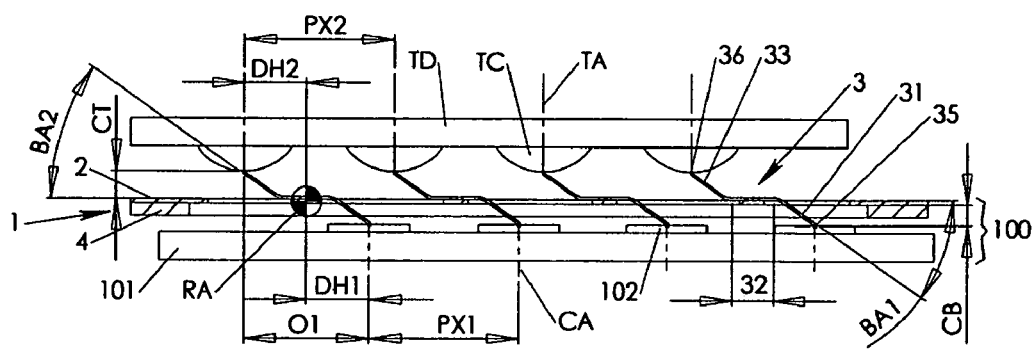
FIG. 3 depicts a cut view of the assembly of FIG. 1 as indicated in FIG. 2 by the section line A—A.

The present invention may include embodiments, in which the see-saw structures 3 are shaped, positioned and/or oriented for defining first and second contact patterns that differ from each other. This may be of particular advantage, where the interconnect assembly 1 is a modular part of a probe apparatus 100 as shown in FIG. 3. In such a probe apparatus 100, apparatus contacts 102 may be provided by a contact base 101 with a fixed first contact pattern. A variety of interconnect assemblies 1 may be interchangeably utilized to adjust to tested devices TD having varying second contact pattern of test contacts TC.

The carrier grid 21 provides resilient features such as torsion features 215 and optionally flex features 216 (see FIG. 6) that resiliently deform and oppose a displacement of the see-saw structures 3 in operational contact with test contacts TC and apparatus contacts 102. In a first load case the see-saw structures' 3 displacement is substantially a rotational displacement around a rotation axis RA, which is preferably perpendicular to the symmetry plane SP. Rotational displacement takes place, when both groups of apparatus contacts 102 and/or test contacts TC are forced against their corresponding contact tips 35, 36 in a balanced fashion resulting in a torque induced on the see-saw structures 3 due to the horizontal distances DH1, DH2 of the contact tips 35, 36 relative to the rotation axes RA.

In a second load case, where only one group of the apparatus contacts 102 or test contacts TC is forced against their corresponding tips 35 or 36 or where the opposing forces experienced by corresponding contact tips 35, 36 are not fully balanced, the resilient features also resiliently oppose a substantially vertical displacement of the see-saw structures 3.

In an exemplary application, the interconnect assembly 1 may be assembled in the probe apparatus 100 such that the contact tips 35 are in permanent pressure contact with their respective apparatus contacts 102. At the time between test cycles, where no tested device TD is forced against the contact tips 36, the second load case is experienced by the interconnect assembly 1. At the time a tested device TD is placed in a test position relative to the probe apparatus 100, the first load case is experienced by the interconnect assembly 1.

The contact forces experienced by the contact tips 35, 36 result mainly from the resilient properties of the resilient features in conjunction with a displacement of the contact tips 35, 36 along their respective apparatus contact axes CA and test contact axes TA. The tip's 35, 36 displacements are induced by the corresponding contacts 102, TC. The see-saw structures 3 are preferably configured as substantially rigid elements relative to the resilient features, even though some resilient deformation may also occur in the see-saw structures 3.

Each see saw structure 3 and its corresponding resilient features 215, 216 define an interconnect stage that is preferably configured to balance opposing contact forces resulting from substantially equal displacements induced on both contact tips 35, 36. The preferred interconnect stage configuration includes a rotationally symmetric configuration of the see-saw structure 3 with respect to the rotation axis RA. The preferred interconnect stage configuration includes also a rotationally symmetric configuration of the resilient features 215, 216 with respect to the rotation axis RA.

The rotationally symmetric configuration of the resilient features 215, 216 includes substantially rotationally symmetric shapes of the resilient features 215, 216 with respect to the rotation axis RA and substantially rotationally symmetric boundary conditions of the resilient features 215, 216 as may be well appreciated by anyone skilled in the art.

The rotationally symmetric configuration of the see-saw structure 3 includes the planar central portion 32 horizontally evenly extending around an intersection between the symmetry plane SP and the rotation axis RA as well as substantially equal horizontal distances DH1, DH2 and vertical distance CT, CB of the contact tips 35, 36 relative to the rotation axis RA.

For a given size of the central portion 32, the positions of the contact tips 35, 36 relative to the rotation axis RA and the dielectric film 2 is mainly defined by a length of the peripheral arms 31, 35 and their respective bending angles BA1, BA2. The vertical distances CT, CB may be selected for sufficient clearance between the contacts TC, 102 and elements of the interconnect assembly 1 under operational conditions. A first proportion between distances DH1 and CT as well as a second proportion between distances DH2 and CB may be adjusted to vary a scribing motion of the contact tips 35, 36 on their corresponding contacts TC, 102 as may be well appreciated by anyone skilled in the art.

Figure 4A:
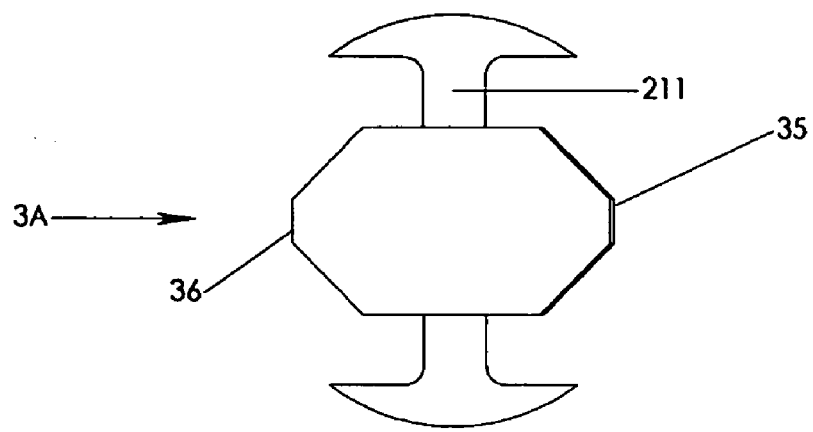
FIGS. 4A, 4B, 4C are detail views of FIG. 2 showing various exemplary configurations of a see-saw interconnect structure.
Figure 4B:
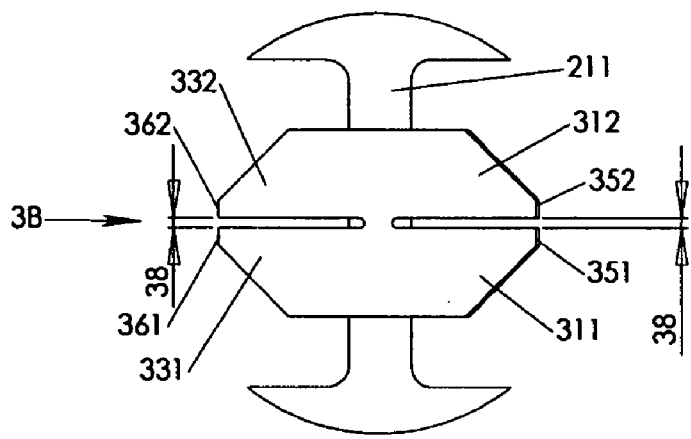
Figure 4C:
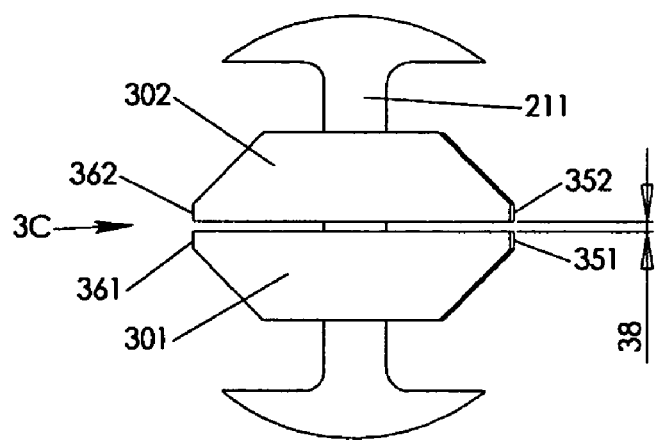

Since the spring suspension of the interconnect stages is provided by the resilient features 215, 216, the see-saw structures 3 may be configured and optimized mainly for transmitting an electrical current and/or voltage with minimum resistance between a test contact TC and a corresponding probe apparatus contact 102. FIGS. 4A–4C depict exemplarily configured see-saw structures 3A–3C.

In FIG. 4A, an exemplary see-saw structure 3A provides a single conductive path between the contact tips 35, 36. In FIG. 4B, an exemplary see-saw structure 3B features slots 38 that propagate from the contact tip segments 351, 352, 361, 362 towards the center of the see-saw structure 3B separating arm segments 311, 312, 331, 332, and optionally some of the central portion 32. Increasing the number of arm segments 311, 312, 331, 332 and the number of contact tip segments 351, 352, 361, 362 provides for some flexibility of the see-saw structure 3B to compensate for eventual shape irregularities of the contacts TC, 102 and eventually leverages contact resistance discrepancies between adjacent contact tip segments 351, 352 and 361, 362.

In FIG. 4C, an exemplary see-saw structure 3C features two entities 301, 302 conductively separated by the slot 38 continuously propagating between the opposing tip segments 351, 352, and 361, 362. The see-saw structure 3C provides a dual path connection between a single set of corresponding contacts TC and 102. As may be well appreciated by anyone skilled in the art, more than a single slot 38 may be utilized to provide a partial or full multipath connection between opposing contacts TC and 102 in a number larger than two.

Figure 5A:
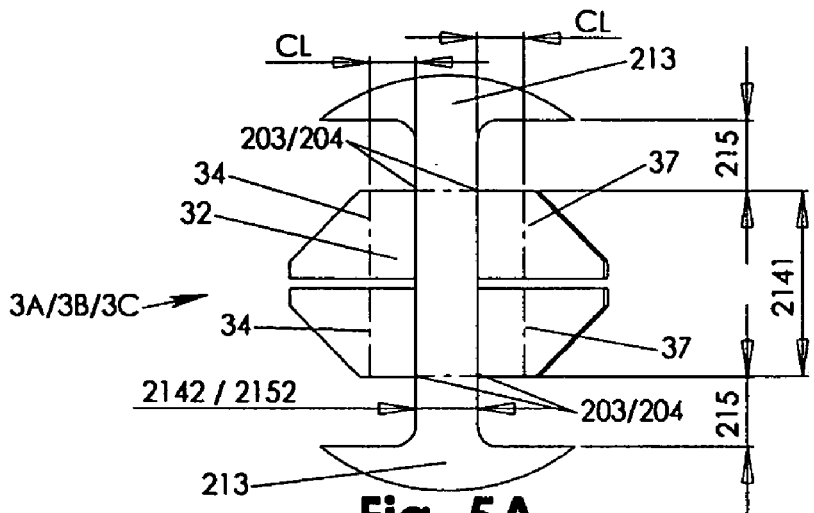
FIGS. 5A, 5B, 5C are detail views of FIG. 2 showing various exemplary configurations of an interface between an interconnect structure and a torsion feature.

The mechanical interface between see-saw structures 3, 3A, 3B, 3C and the carrier grid 21 has significant influence on the current flow limitations across the see-saw structures 3, 3A, 3B, 3C. This is because temperature rise that results from current flow tends to degrade the mechanical connection between the see-saw structure 3, 3A, 3B, 3C and the interface portion 214. In the exemplary case of an adhesive connection between planar center portion 32 and interface portion 214, the adhesive strength degrades with increasing temperature. On the other hand at a final fabrication stage where the see-saw structure 3, 3A, 3B, 3C is already combined with the carrier grid 21, the 3D forming of the see-saw structure 3, 3A, 3B, 3C, may require clearance areas CL on both sides of the planar center portion 32 immediately adjacent the bending edges 34, 37. The clearance areas CL provide direct access for a clamping tool eventually necessary for fixedly holding the planar center portion 32 during the 3D forming of the peripheral arms 31, 35 and/or the arm segments 311, 312, 351, 352. This case is depicted in FIG. 5A, where the interface portion 214 has an interface length 2141 that corresponds to the planar center portion's 32 width and an interface width 2142 that corresponds to the torsion features' width 2152. In that case, the Y-oriented grid member 211 has a continuous width between the grid nodes 213.

In the embodiment depicted in FIG. 5A, shear peak points 203 are located at the intersections between the boundaries of the Y-oriented grid member and the planar center portion 32. In the embodiment of FIG. 5A, the shear peak points 203 and delamination origins 204 coincide as may be well appreciated by anyone skilled in the art. The delamination origins 204 are those points where a delamination between interface portion 214 and planar center portion 32 initiates with high probability.

Figure 5B:
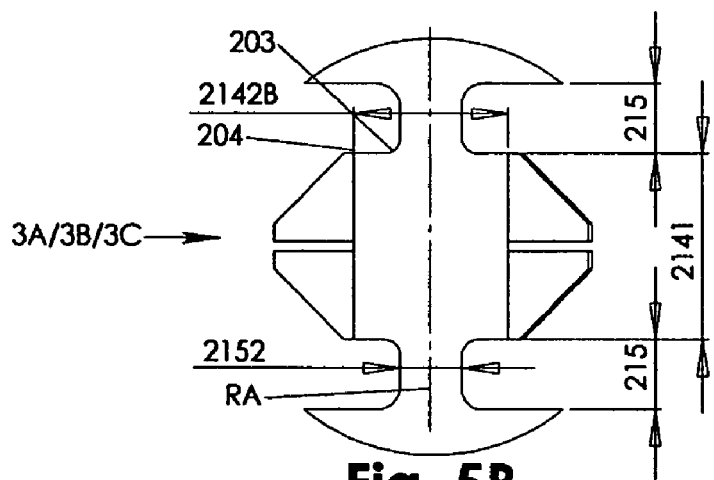

In an alternate embodiment shown in FIG. 5B, the interface portion 214 has a modified interface width 2142B that is substantially larger than the torque feature width 2152. As a favorable result, the delamination origins 204 are in a substantially larger distance to the rotation axis RA than the shear peak points 203. In this embodiment and for a given peak shear stress in the shear peak points 203, the adhesive strength may be brought to lower levels than in the embodiment of FIG. 5A. Consequently, the see-saw structure 3, 3A, 3B, 3C may be operated at increased temperatures during increased current flow.

Figure 5C:
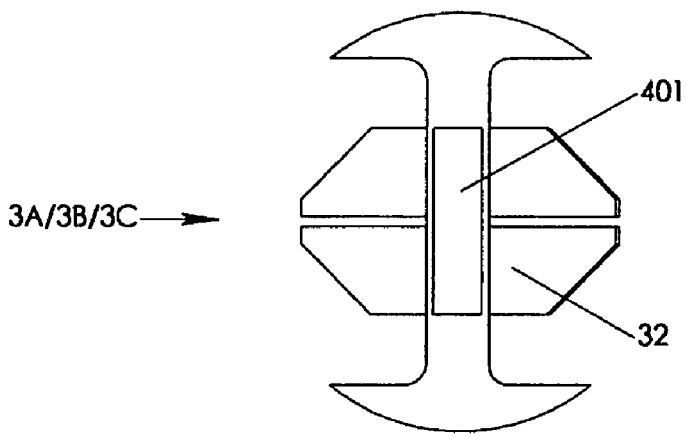

In a further embodiment shown in FIG. 5C, the interface portion 214 may be sandwiched between the planar center portion 32 and a stiffening structure 401. The stiffening structure 401 may be coplanar with the circumferential support frame 4 and may be a remainder after shaping and releasing the carrier grid 22 during fabrication of the interconnect assembly 1 as is explained in more detail in the below. The stiffening structure 401 may assist in increasing the overall stiffness of the see-saw structure 3, 3A, 3B, 3C especially in the case where a number of conductively separated entities 301, 302 are utilized for multipath current transmission.

Figure 6:
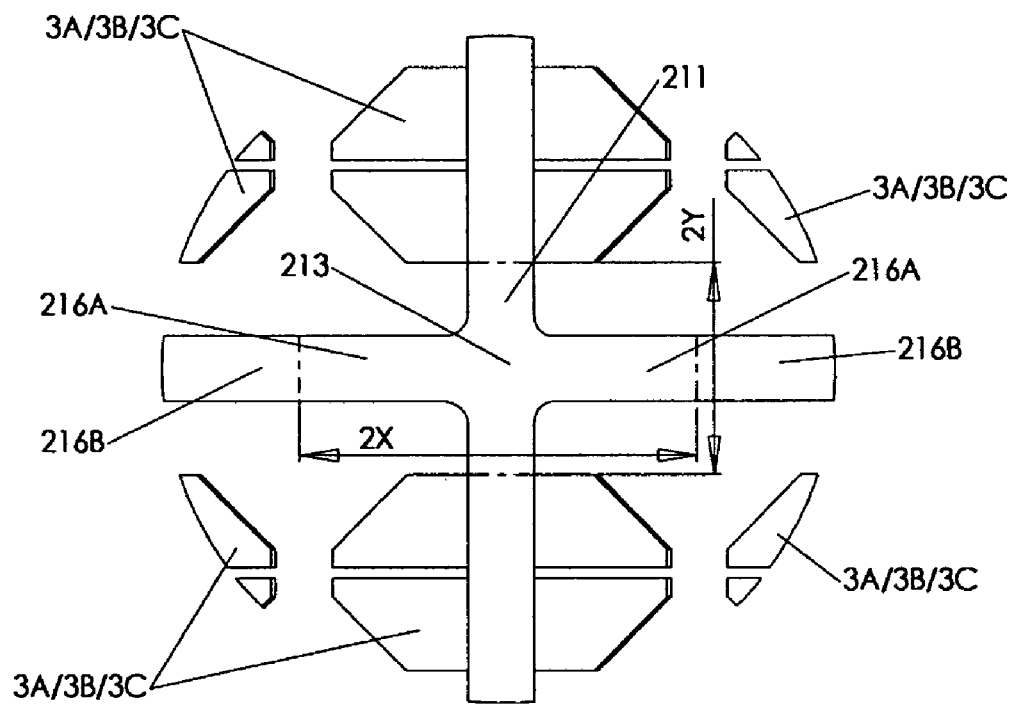
FIG. 6 is a detail view of FIG. 2 centering on an outlined exemplary resilient portion.

In the enlarged detail view of FIG. 6, the torque features 215 and flex features 216 are shown within their envelope 2X, 2Y. The Y-extension of the envelope is defined as the lateral distance between adjacent see-saw structures 3, 3A, 3B, 3C. The X-extension 2X of the envelope extends between zero torque boundaries of adjacent flex features 216A and 216B. The zero torque boundary is the line along which the opposing torques of the adjacent flex features 216A, 216B balance each other as may be well appreciated by anyone skilled in the art.

In the preferred embodiment and as shown in the FIGS. 1–3 with a homogeneous carrier grid 21 and a homogeneous array of symmetrically configured resilient features 215, 216, the zero torque boundary may be at the same time be a zero displacement boundary as may be well appreciated by anyone skilled in the art. As a favorable result, strain and displacement in each of the interconnect stages' resilient features 215, 216 is highly uniform resulting in consistent contacting properties of all interconnect stages of the interconnect assembly 1 while keeping the carrier grid 21 free of any interposed rigid structures. This again provides a maximum available footprint for each of the see-saw structures 3, 3A, 3B, 3C and a highly efficient, robust and wear resistant operation of the interconnect assembly 1.

Figure 7:
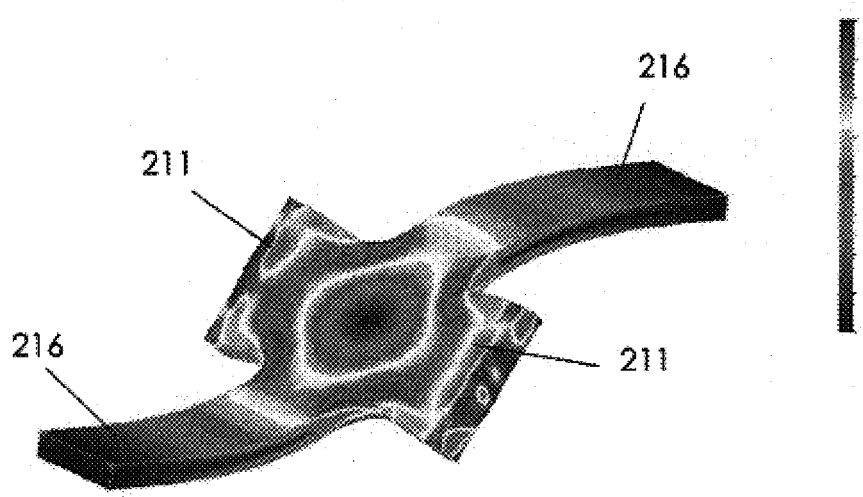
FIG. 7 shows an exemplary stress analysis of the resilient portion of FIG. 6
Figure 8:
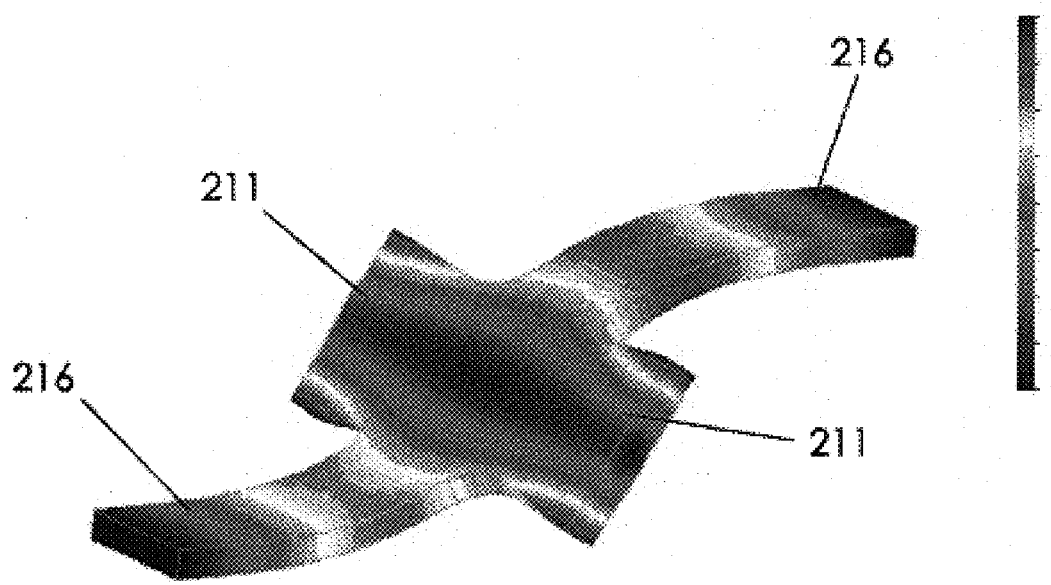
FIG. 8 shows an exemplary displacement analysis of the resilient portion of FIG. 6

The exemplary stress and displacement analyses of FIGS. 7, 8 illustrate maximum stress and displacement for the resilient features 213, 216 within the envelope 2X, 2Y. Stress and displacement distribution corresponds to the color array included in the Figures with the minima being depicted in dark blue and the maxima being depicted in red.

Figure 9:
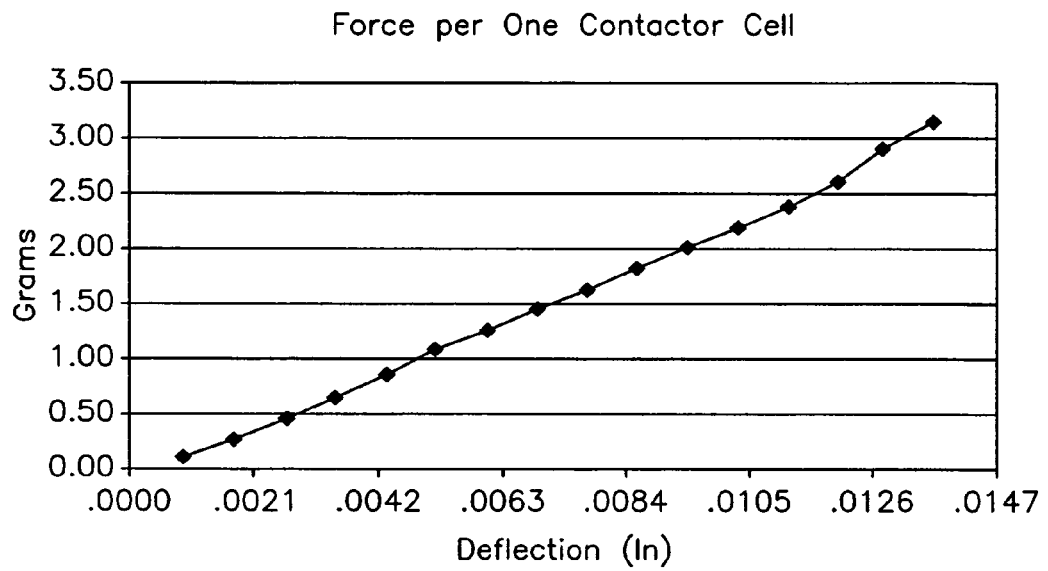
FIG. 9 is a graph of deflection over load for an exemplary interconnect stage according to FIGS. 1–3, 4B, 5A.

The graph of FIG. 9 shows the deflection over load for an exemplary interconnect stage according to FIGS. 1–3, 4B, 5A having pitches PX1, PX2, of approximately 1.22 mm and pitches PY1, PY2 of approximately 1.27 mm. The offset O1 is about 1.04 mm. The material of the see-saw structure 3 is NiMn alloy electro plated with a thickness of preferably about between 0.02–0.03 mm. The thin film 2 is made of polyimide with a thickness of about 0.04 mm. The width of the grid members 211, 212 is about 0.2 mm.

Figure 10:
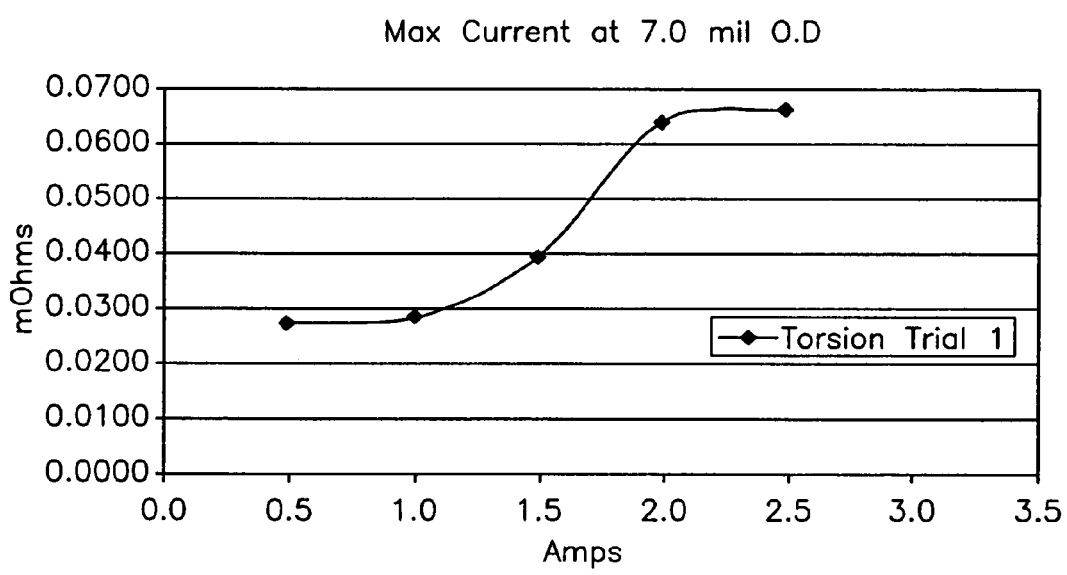
FIG. 10 is a graph of resistance over current flow for an exemplary interconnect stage according to FIGS. 1–3, 4B, 5A.

The graph of FIG. 10 shows two trial curves for transmission resistance over current flow for an exemplary interconnect stage according to FIGS. 1–3, 4B, 5A. As can be seen in curve of the torsion trial 1, the transmission resistance increases substantially at about 1.5A current flow and about 0.04 mOhms. This indicates a temperature rise to a level where the bonding strength of the adhesive decreases below the shear stress in the delamination origins 204. Consequently, dilamination is initiated resulting in a reduced displacement of the resilient features 215, 216 and a corresponding decrease of the opposing spring force provided by the resilient features 215, 216. This in turn reduces the contact pressure and well known scribing between the contact tip segments 311, 312, 331, 332 and their corresponding contacts TC, 102 such that the contact resistance in the interface between the contact tip segments 311, 312, 331, 332 and their corresponding contacts TC, 102 gradually increases.

Figure 11:
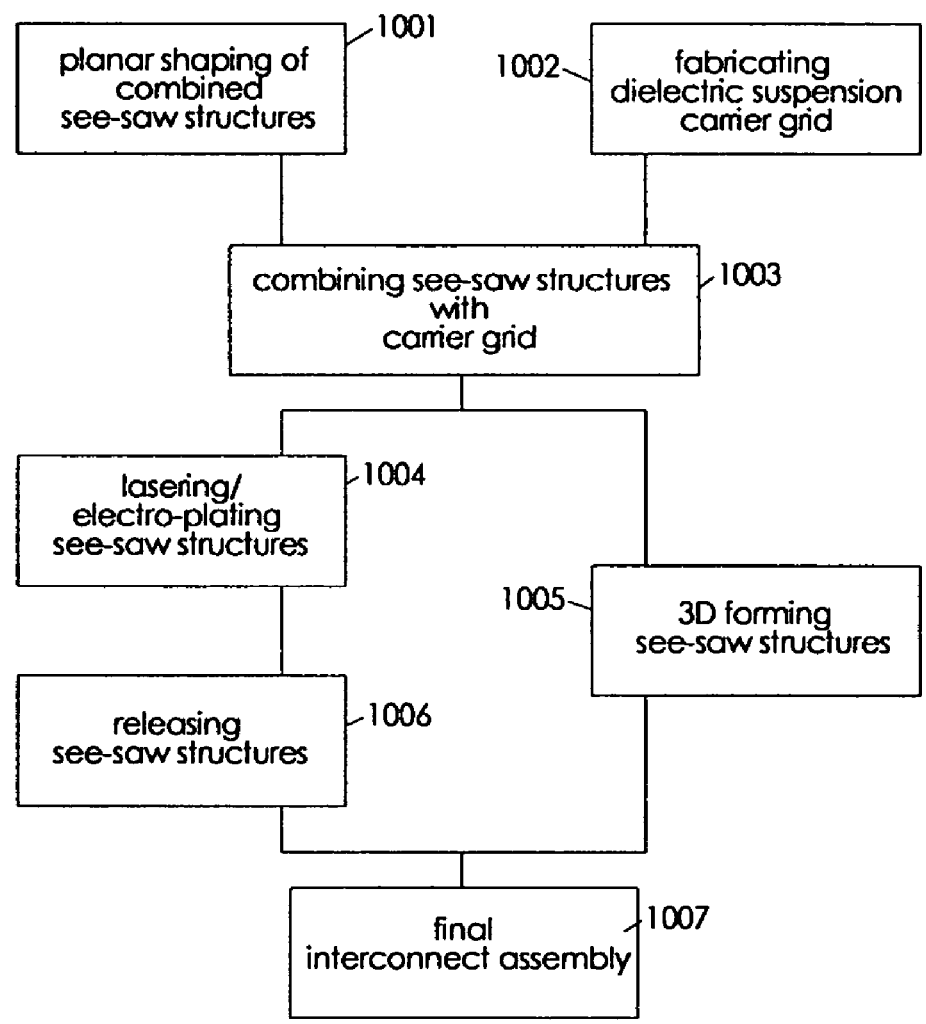
FIG. 11 is a block diagram of exemplary fabrication steps involved in making the interconnect assembly of FIGS. 1–3.

Fabrication of interconnect assembly 1 includes well known fabrication steps summarized in FIG. 11. The block 1001 represents the fabrication of the see-saw structures 3, 3A, 3B, 3C in conductively combined arrangement that corresponds to their final arrangement within the interconnect assembly 1. The involved steps may include well known patterning and electroplating of a planar layout of the see-saw structures 3, 3A, 3B, 3C preferably on top of a sacrificial stainless steel substrate.

The block 1002 represents the fabrication of the carrier grid 21 together with the circumferential support frame 4 and eventual stiffening structures 401. A dielectric thin film 2 deposited on a substrate is patterned and shaped. The dielectric thin film 2 is preferably made of a polymer such as polyimide. The substrate may be stainless steel or any other suitable material as may be appreciated by anyone skilled in the art. The carrier grid 21 is preferably a dielectric laminate that is laminated to the conductive layer and consecutively released by removing the underneath substrate except the eventually stiffening structures 401, which may be altered in thickness by a separate material removal process.

According to block 1003, the prefabricated and conductively connected see-saw structures 3, 3A, 3B, 3C are combined with the previously fabricated carrier grid by adhesive bonding or other well known techniques for combining a metal structure with a polymer. In following steps depicted by blocks 1004, 1005 and 1006, the see-saw structures 3, 3A, 3B, 3C may be lasered and electro plated, 3D formed and released from their conductive connection by well known techniques. The conductive connection is a particular necessity in case of electro deposition processes utilized in combination with a dielectric carrier grid 21 to include all see-saw structures 3, 3A, 3B, 3C in a single electric connection for efficient simultaneous plating as is well known to anyone skilled in the art.

The scope of the invention is not limited to a particular outside contour of the see-saw structures 3, 3A, 3B, 3C as long as their function is warranted as described in the above. Likewise, the scope of the invention is not limited by a particular fashion by which the interconnect stages are arrayed within an interconnect assembly as may be well appreciated by anyone skilled in the art.

Accordingly, the scope of the invention described in the above specification is set forth by the following claims and their legal equivalents.

What is claimed is:

1. An interconnect assembly comprising:
    a carrier grid, at least a portion of the carrier grid having a resilient property; and
    a plurality of conductive contact structures supported by the carrier grid,
    at least a portion of the carrier grid compliantly bending upon a predetermined force being applied to at least a portion of the conductive contact structures, the resilient property of the carrier grid being configured to oppose displacement of the plurality of conductive contact structures, wherein the resilient property of the carrier grid opposes at least one of (1) rotational displacement of the conductive contact structures about a rotative axis, or (2) vertical displacement of the conductive contact structures.

2. The interconnect assembly of claim 1 wherein the carrier grid includes a plurality of x-axis grid members and a plurality of y-axis grid members, corresponding ones of the x-axis grid members and y-axis grid members extending to nodes of the carrier grid.

3. The interconnect assembly of claim 2 wherein the conductive contact structures are secured to respective y-axis grid members.

4. The interconnect assembly of claim 1 wherein each of the conductive contact structures includes (1) a center portion secured to the carrier grid, (2) a first arm portion extending along a downward angle from the center portion, and (3) a second arm portion extending along an upward angle from the center portion.

5. The interconnect assembly of claim 1 wherein the interconnect assembly is configured to provide electrical interconnection between a first structure and a second structure, a first contact tip of each of the conductive contact structures being fixedly electrically coupled to electrical contacts of one of the first structure and the second structure.

6. The interconnect assembly of claim 1 wherein each of the conductive contact structures includes a first contact tip at a first end thereof, and a second contact tip at a second end thereof, at least a portion of the conductive contact structures defining a slot dividing at least one of the first contact tip and/or the second contact tip into a left tip portion and a right tip portion.

7. The interconnect assembly of claim 1 wherein each of the conductive contact structures includes a first contact tip at a first end thereof, and a second contact tip at a second end thereof, at least a portion of the conductive contact structures defining a slot extending from the first contact tip to the second contact tip and dividing the conductive contact structure into a left portion and a right portion.

8. The interconnect assembly of claim 1 wherein each of the conductive contact structures includes a core and a conductive plating disposed on the core.

9. The interconnect assembly of claim 8 wherein the core includes NiMn alloy and the plating is an electroplating.

10. The interconnect assembly of claim 1 wherein the carrier grid comprises a polyimide layer.

11. The interconnect assembly of claim 1 wherein the carrier grid includes a support layer and a dielectric layer provided on the support layer, and wherein predetermined portions of the carrier grid are void of the support layer such that the predetermined portions of the support layer have a resilient property with respect to other portions of the carrier grid.

12. The interconnect assembly of claim 11 wherein the support layer is a metallic layer, and the dielectric layer comprises a polyimide material.

13. An interconnect assembly comprising:
a carrier grid, at least a portion of the carrier grid having a resilient property; and
a plurality of conductive contact structures supported by the carrier grid,
at least a portion of the carrier grid compliantly bending upon a predetermined force being applied to at least a portion of the conductive contact structures, the resilient property of the carrier arid being configured to oppose displacement of the plurality of conductive contact structures, wherein at least one of the x-axis grid members and/or the y-axis grid members includes an interface region to which a respective conductive contact structure is secured, the interface region having a width dimension greater than the remainder of the corresponding x-axis grid member or y-axis grid member.

14. An interconnect assembly comprising:
a carrier grid, at least a portion of the carrier grid having a resilient property; and
a plurality of conductive contact structures supported by the carrier grid,
at least a portion of the carrier grid compliantly bending upon a predetermined force being applied to at least a portion of the conductive contact structures, the resilient property of the carrier grid being configured to oppose displacement of the plurality of conductive contact structures, wherein the conductive contact structures are secured to the carrier grid on a first surface thereof at an interface region, the interconnect assembly additionally comprising a stiffening structure on a second surface of the carrier grid opposite the interface region.

15. An interconnect assembly comprising:
a carrier grid, at least a portion of the carrier grid having a resilient property; and
a plurality of conductive contact structures supported by the carrier grid,
at least a portion of the carrier grid compliantly bending upon a predetermined force being applied to at least a portion of the conductive contact structures, the conductive contact structures being configured to pivot about a rotative axis upon the application of the predetermined force, wherein the resilient property of the carrier grid opposes pivoting of the conductive contact structures about the rotative axis, wherein the carrier grid includes a plurality of x-axis grid members and a plurality of y-axis grid members, corresponding ones of the x-axis grid members and y-axis grid members extending to nodes of the carrier grid.

16. The interconnect assembly of claim 15 wherein at least one of the x-axis grid members and/or the y-axis grid members includes an interface region to which a respective conductive contact structure is secured, the interface region having a width dimension greater than the remainder of the corresponding x-axis grid member or y-axis grid member.

17. The interconnect assembly of claim 15 wherein the conductive contact structures are secured to respective y-axis grid members.

18. The interconnect assembly of claim 15 wherein each of the conductive contact structures includes (1) a center portion secured to the carrier grid, (2) a first arm portion extending along a downward angle from the center portion, and (3) a second arm portion extending along an upward angle from the center portion.

19. The interconnect assembly of claim 15 wherein the interconnect assembly is configured to provide electrical interconnection between a first structure and a second structure, a first contact tip of each of the conductive contact structures being fixedly electrically coupled to electrical contacts of one of the first structure and the second structure.

20. The interconnect assembly of claim 15 wherein each of the conductive contact structures includes a first contact tip at a first end thereof, and a second contact tip at a second end thereof, at least a portion of the conductive contact structures defining a slot dividing at least one of the first contact tip and/or the second contact tip into a left tip portion and a right tip portion.

21. The interconnect assembly of claim 15 wherein each of the conductive contact structures includes a first contact tip at a first end thereof, and a second contact tip at a second end thereof, at least a portion of the conductive contact structures defining a slot extending from the first contact tip to the second contact tip and dividing the conductive contact structure into a left portion and a right portion.

22. The interconnect assembly of claim 15 wherein the conductive contact structures are secured to the carrier grid on a first surface thereof at an interface region, the interconnect assembly additionally comprising a stiffening structure on a second surface of the carrier grid opposite the interface region.

23. The interconnect assembly of claim 15 wherein each of the conductive contact structures includes a core and a conductive plating disposed on the core.

24. The interconnect assembly of claim 23 wherein the core includes an NiMn alloy and the plating is an electroplating.

25. The interconnect assembly of claim 15 wherein the carrier grid comprises a polyimide layer.

26. The interconnect assembly of claim 15 wherein the carrier grid includes a support layer and a dielectric layer provided on the support layer, and wherein predetermined portions of the carrier grid are void of the support layer such that the predetermined portions of the support layer have a resilient property with respect to other portions of the carrier grid.

27. The interconnect assembly of claim 26 wherein the support layer is a metallic layer, and the dielectric layer comprises a polyimide material.

28. An interconnect assembly comprising:
a carrier grid, at least a portion of the carrier grid having a resilient property, the carrier grid including a plurality of x-axis grid members and a plurality of y-axis grid members such that corresponding ones of the x-axis grid members and y-axis grid members extend to nodes of the carrier grid; and
a plurality of conductive contact structures supported by the carrier grid,
at least a portion of the carrier grid compliantly bending upon a predetermined force being applied to at least a portion of the conductive contact structures, the conductive contact structures being configured to pivot about a rotative axis upon the application of the predetermined force, wherein at least one of the x-axis grid members and/or the y-axis grid members includes an interface region to which a respective conductive contact structure is secured, the interface region having a width dimension greater than the remainder of the corresponding x-axis grid member or y-axis grid member.

29. The interconnect assembly of claim 28 wherein the resilient property of the carrier grid opposes pivoting of the conductive contact structures about the rotative axis.

30. The interconnect assembly of claim 28 wherein the conductive contact structures are secured to respective y-axis grid members.

31. The interconnect assembly of claim 28 wherein each of the conductive contact structures includes (1) a center portion secured to the carrier grid, (2) a first arm portion extending along a downward angle from the center portion, and (3) a second arm portion extending along an upward angle from the center portion.

32. The interconnect assembly of claim 28 wherein the interconnect assembly is configured to provide electrical interconnection between a first structure and a second structure, a first contact tip of each of the conductive contact structures being fixedly electrically coupled to electrical contacts of one of the first structure and the second structure.

33. The interconnect assembly of claim 28 wherein each of the conductive contact structures includes a first contact tip at a first end thereof, and a second contact tip at a second end thereof at least a portion of the conductive contact structures defining a slot dividing at least one of the first contact tip and/or the second contact tip into a left tip portion and a right tip portion.

34. The interconnect assembly of claim 28 wherein each of the conductive contact structures includes a first contact tip at a first end thereof, and a second contact tip at a second end thereof, at least a portion of the conductive contact structures defining a slot extending from the first contact tip to the second contact tip and dividing the conductive contact structure into a left portion and a right portion.

35. The interconnect assembly of claim 28 wherein the conductive contact structures are secured to the carrier grid on a first surface thereof at an interface region, the interconnect assembly additionally comprising a stiffening structure on a second surface of the carrier grid opposite the interface region.

36. The interconnect assembly of claim 28 wherein each of the conductive contact structures includes a core and a conductive plating disposed on the core.

37. The interconnect assembly of claim 36 wherein the core includes an NiMn alloy and the plating is an electroplating.

38. The interconnect assembly of claim 28 wherein the carrier grid comprises a polyimide layer.

39. The interconnect assembly of claim 28 wherein the carrier grid includes a support layer and a dielectric layer provided on the support layer, and wherein predetermined portions of the carrier grid are void of the support layer such that the predetermined portions of the support layer have a resilient property with respect to other portions of the carrier grid.

40. The interconnect assembly of claim 39 wherein the support layer is a metallic layer, and the dielectric layer comprises a polyimide material.

41. An interconnect assembly comprising:

a carrier grid at least a portion of the carrier grid having a resilient property;

a plurality of conductive contact structures supported by the carrier grid, the conductive contact structures being secured to the carrier grid on a first surface thereof at an interface region; and a stiffening structure on a second surface of the carrier grid opposite the interface region, at least a portion of the carrier grid compliantly bending upon a predetermined force being applied to at least a portion of the conductive contact structures, the conductive contact structures being configured to pivot about a rotative axis upon the application of the predetermined force.

42. The interconnect assembly of claim 41 wherein the resilient property of the carrier grid opposes pivoting of the conductive contact structures about the rotative axis.

43. The interconnect assembly of claim 41 wherein the carrier grid includes a plurality of x-axis grid members and a plurality of y-axis grid members, corresponding ones of the x-axis grid members and y-axis grid members extending to nodes of the carrier grid.

44. The interconnect assembly of claim 43 wherein at least one of the grid members and/or the y-axis grid members includes an interface region to which a respective conductive contact structure is secured, the interface region having a width dimension greater than the remainder of the corresponding x-axis grid member or y-axis grid member.

45. The interconnect assembly of claim 43 wherein the conductive contact structures are secured to respective y-axis grid members.

46. The interconnect assembly of claim 41 wherein each of the conductive contact structures includes (1) a center portion secured to the carrier grid, (2) a first arm portion extending along a downward angle from the center portion, and (3) a second arm portion extending along an upward angle from the center portion.

47. The interconnect assembly of claim 41 wherein the interconnect assembly is configured to provide electrical interconnection between a first structure and a second structure, a first contact tip of each of the conductive contact structures being fixedly electrically coupled to electrical contacts of one of the first structure and the second structure.

48. The interconnect assembly of claim 41 wherein each of the conductive contact structures includes a first contact tip at a first end thereof, and a second contact tip at a second end thereof at least a portion of the conductive contact structures defining a slot dividing at least one of the first contact tip and/or the second contact tip into a left tip portion and a right tip portion.

49. The interconnect assembly of claim 41 wherein each of the conductive contact structures includes a first contact tip at a first end thereof, and a second contact tip at a second end thereof at least a portion of the conductive contact structure defining a slot extending from the first contact tip to the second contact tip and dividing the conductive contact structure into a left portion and a right portion.

50. The interconnect assembly of claim 41 wherein each of the conductive contact structures includes a core and a conductive plating disposed on the core.

51. The interconnect assembly of claim 50 wherein the core includes an NiMn alloy and the plating is an electroplating.

52. The interconnect assembly of claim 41 wherein the carrier grid comprises a polyimide layer.

53. The interconnect assembly of claim 41 wherein the carrier grid includes a support layer and a dielectric layer provided on the support layer, and wherein predetermined portions of the carrier grid are void of the support layer such that the predetermined portions of the support layer have a resilient property with respect to other portions of the carrier grid.

54. The interconnect assembly of claim 53 wherein the support layer is a metallic layer, and the dielectric layer comprises a polyimide material.

* * * * *

UNITED STATES PATENT AND TRADEMARK OFFICE
CERTIFICATE OF CORRECTION

| | | |
|---|---|---|
| PATENT NO. | : 7,189,078 B2 | Page 1 of 1 |
| APPLICATION NO. | : 11/077054 | |
| DATED | : March 13, 2007 | |
| INVENTOR(S) | : January Kister, James Jaquette and Gene Tokraks | |

It is certified that error appears in the above-identified patent and that said Letters Patent is hereby corrected as shown below:

Column 9, line 23, "carrier arid being" should read --carrier grid being--;
Column 11, line 32, "end thereof at" should read --end thereof, at--;
Column 12, line 27, "least one of the grid" should read --least one of the x-axis grid--;
Column 12, line 49, "end thereof at" should read --end thereof, at--;
Column 12, line 58, "end thereof at" should read --end thereof, at--;
Column 12, line 59, "contact structure defining" should read --contact structures defining--

Signed and Sealed this

Twenty-fifth Day of March, 2008

JON W. DUDAS
*Director of the United States Patent and Trademark Office*